(12) United States Patent
Yamada

(10) Patent No.: US 6,646,301 B2
(45) Date of Patent: Nov. 11, 2003

(54) FLOATING GATE SEMICONDUCTOR DEVICE

(75) Inventor: Kenji Yamada, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/016,084

(22) Filed: Dec. 12, 2001

(65) Prior Publication Data
US 2002/0048961 A1 Apr. 25, 2002

Related U.S. Application Data

(62) Division of application No. 09/490,990, filed on Jan. 26, 2000, now Pat. No. 6,368,976.

(30) Foreign Application Priority Data

Jan. 26, 1999 (JP) .............................. 11-017132

(51) Int. Cl.$^7$ ...................... H01L 27/108; H01L 29/788
(52) U.S. Cl. ........................ 257/320; 257/314; 257/390; 257/391; 257/317; 257/321
(58) Field of Search ................................. 438/266, 257, 438/267, 258; 365/185.01, 185.1, 185.24; 257/315, 316, 317, 321, 324, 325, 314, 320, 390, 391

(56) References Cited

U.S. PATENT DOCUMENTS

| | | | | |
|---|---|---|---|---|
| 5,780,892 A | * | 7/1998 | Chen ........................... | 257/317 |
| 5,879,993 A | * | 3/1999 | Chien et al. ................ | 438/266 |
| 5,936,883 A | * | 8/1999 | Kurooka et al. ....... | 365/185.01 |

\* cited by examiner

Primary Examiner—Minh Loan Tran
Assistant Examiner—Tan Tran
(74) Attorney, Agent, or Firm—Hogan & Hartson, LLP

(57) ABSTRACT

A semiconductor device has a floating gate having a side wall with a generally vertical upper section and a tapered lower section and a first insulation film formed on the side wall of the floating gate by thermal oxidation. The first insulation film has an upper section and a lower section that is thicker than the upper section. The semiconductor device also has a second insulation film formed on the first insulation film, and a control gate formed on the second insulation film. As a result, an insulation film between the control gate and the floating gate has a sufficient thickness difference between the upper section and the lower section of the floating gate.

23 Claims, 4 Drawing Sheets

FLOATING GATE SEMICONDUCTOR DEVICE

This is a divisional of application Ser. No. 09/490,990 filed Jan. 26, 2000, which application is hereby incorporated by reference in its entirety U.S. Pat. No. 6,368,976.

BACKGROUND OF THE INVENTION

1. Field of the Invention

The present invention relates to a semiconductor device and a method for manufacturing the same. More particularly, the present invention relates to a semiconductor device having an insulation film between a control gate and a floating gate, and a method for manufacturing the same.

2. Related Art

FIGS. 6–12 show a semiconductor device (split gate flash memory) in cross section, manufactured by a conventional method.

As shown in FIG. 6, the surface of a P-type silicon substrate 1 is subjected to a dry-oxidation at 1000° C. to form a gate oxide film 2 on the P-type silicon substrate 1. A polycrystal silicon film 3 is deposited on the gate oxide film 2 by a reduced pressure CVD (Chemical Vapor Deposition), and an anti-oxidation film 4 composed of $Si_3N_4$ is deposited on the polycrystal silicon film 3. Then, a resist 5 is coated on the anti-oxidation film 4, and the resist 5 is exposed and developed to thereby form an opening 6 over an area where a floating gate is formed.

Referring to FIG. 7, the anti-oxidation film 4 that is exposed through the opening 6 is dry-etched using the resist film 5 as a mask, to thereby form an opening 7 in the anti-oxidation film 4.

Referring to FIG. 8, the resist film 5 is removed. Then, the polycrystal silicon film 3 that is exposed through the opening 7 is selectively etched using the anti-oxidation film 4 as a mask to thereby form a selective oxide film 8 in the polycrystal silicon film 3.

Then, referring to FIG. 9, the anti-oxidation film 4 is removed by heated phosphoric acid. Then the polycrystal silicon film 3 and the gate oxide film 2 are anisotropically etched in a vertical direction using the selective oxide film 8 as a mask, to thereby form a floating gate 9 under the selective oxide film 8.

Then, referring to FIG. 10, a tunnel insulation film ($SiO_2$ film) 12 is formed on the entire surface including the floating gate 9 and the selective oxide film 8 by thermal oxidation or a high temperature reduced-pressure CVD method. Then, an insulation film 10 composed of $Si_3N_4$ is deposited on the tunnel insulation film 12.

Referring to FIG. 11, the insulation film 10 is anisotropically etched in a vertical direction to form a side insulation film 11 at a lower section of the side wall of the floating gate 9. Then, the surface is washed with a cleansing solution of $NH_4OH+H_2O_2$, for example, to remove a damaged layer (not shown) in the surface of the tunnel insulation film ($SiO_2$ film) 12 that is caused by the anisotropic etching.

Referring to FIG. 12, an N-type polycrystal silicon film 13 is deposited on the tunnel insulation film 12 within a phosphine ($PH_3$) atmosphere by a reduced pressure CVD method. The polycrystal silicon film 13 and the tunneling insulation film 12 are patterned, such that the polycrystal silicon film 13 and the insulation film 12 remain in an area starting from a point on the selective oxide film 8, across one side of the floating gate 9, to a point on the P-type silicon substrate 1. The remaining polycrystal silicon film defines a control gate 13.

An N-type impurity such as arsenic, phosphorous and the like is introduced in the P-type silicon substrate 1 on both sides of the control gate 13 and the floating gate 9 to form diffusion regions 14 and 15 for source and drain regions in the P-type silicon substrate 1.

In the split gate flash memory shown in FIG. 12, a high voltage (about 12 V) is applied to the control gate 13 to take out electrons from the floating gate 9 as indicated by an arrow 31 to perform an erase operation. On the other hand, electrons are injected from the substrate 1 as indicated by an arrow 33 to perform a writing operation.

It is noted that electrons flow only in a path as indicated by the arrow 31 during the erase operation. Accordingly, while the tunnel insulation film ($SiO_2$ film) between the control gate 13 and the floating gate 9 in an area adjacent the arrow 31 has a predetermined dielectric strength, it needs to have a dielectric strength to withstand a voltage higher than an operating voltage in an area adjacent the arrow 32. More specifically, the area adjacent the arrow 31 may have a dielectric strength to withstand a voltage of 7 V, and the area adjacent the arrow 32 needs to have a dielectric strength to withstand a voltage of about 16 V. Therefore, while the tunnel insulation film 12 has a relatively low dielectric strength in an upper portion of the side wall of the floating gate 9, it needs to have a relatively high dielectric strength in a lower portion of the side wall of the floating gate 9.

Under the circumstances, in the conventional split gate flash memory, a side insulation film 11 is formed on the lower portion of the side wall of the floating gate 9 to increase the thickness of the tunnel insulation film to thereby secure a sufficient dielectric strength in the area adjacent the arrow 32 between the control gate 13 and the floating gate 9.

In the conventional semiconductor device described above, the side insulation film 11 is formed to change the thickness of the insulation film between the control gate 13 and the floating gate 9. However, the formed side insulation film 11 does not provide a sufficient thickness difference in the insulation film between the portions adjacent the arrow 31 and the arrow 32 shown in FIG. 12.

Also, when the $Si_3N_4$ insulation film 10 is anisotropically etched in a vertical direction in the step of forming the side insulation film 11 shown in FIG. 11, a sufficient etching selection ratio with respect to $SiO_2$ of the tunnel insulation film 12 cannot be secured. As a result, the etching selection ratio often becomes low. As a consequence, $SiO_2$ films in the memory cell area and other areas may be etched more than designed, and thus the device characteristics may become unstable.

SUMMARY OF THE PREFERRED EMBODIMENTS

The present invention has been made in view of the problems described above. It is an object of the present invention to provide a semiconductor device having an insulation film between a control gate and a floating gate in which the insulation film has a sufficient thickness difference between at least two separated locations therein, and to provide a method for manufacturing the same.

In order to solve the problems described above, a semiconductor device in accordance with one embodiment of the present invention comprises a floating gate having a side wall with a generally vertical upper section and a tapered lower section, a first insulation film formed on the side wall by thermal oxidation, the first insulation film having a lower section thicker than an upper section thereof, a second insulation film formed on the first insulation film, and a control gate formed on the second insulation film.

A method for manufacturing a semiconductor device, in accordance with one embodiment of the present invention, comprises the steps of: anisotropically etching a polycrystal silicon film using a first insulation film as a mask to form an upper section of a floating gate under the first insulation film; etching the polycrystal silicon film using the first insulation film as a mask to form a lower section of the floating gate having a tapered side wall under the first insulation film; and forming a second insulation film by thermal oxidation on the side wall of the floating gate.

In the above-described method for manufacturing a semiconductor device in accordance with the present invention, the upper section of the floating gate is generally vertically etched. As a result, the insulation film is formed thinly on the upper vertical section even if a thermal oxidation process is conducted on the upper vertical section. On the other hand, the lower section of the floating gate is tapered, and therefore the lower section has a thick layer of polycrystal silicon that is to be oxidized. When the lower section is thermally oxidized, an insulation film thicker than that of the upper section is formed. As a result, the insulation film between the control gate and the floating gate has sufficient thickness difference.

Also, the method for manufacturing a semiconductor device described above may preferably further comprise, subsequent to the step of forming the second insulation film, the step of forming a third insulation film on the second insulation film and the step of forming the control gate on the third insulation film. Preferably, the first insulation film may be an oxide film in a generally LOCOS shape.

Further, in the method for manufacturing a semiconductor device described above, the etching in the step of forming the lower section of the floating gate is conducted by use of a high density plasma at pressures of about 1–10 mTorr with a flow of an etching gas containing HBr and $O_2$ with mixing ratios of about 30:1–10:1. As a result, the polycrystal silicon film is etched in a tapered shape, and the lower section of the side wall of the floating gate is formed in a tapered configuration.

Also, in the method for manufacturing a semiconductor device described above, the etching in the step of forming the upper section of the floating gate is conducted by use of a high density plasma conducted at pressures of about 1–10 mTorr with a flow of an etching gas containing HBr and $O_2$ with mixing ratios of about 80:1–40:1. As a result, the polycrystal silicon film is generally vertically etched, and thus the upper section of the side wall of the floating gate is formed in a generally vertical configuration.

Other features and advantages of the invention will be apparent from the following detailed description, taken in conjunction with the accompanying drawings that illustrate, by way of example, various features of embodiments of the invention.

PREFERRED EMBODIMENTS OF THE INVENTION

An embodiment of the present invention will be described with reference to the accompanying drawings.

FIGS. 1–5 show a semiconductor device in cross section, manufactured by a semiconductor device manufacturing method in accordance with the embodiment. A split gate flash memory, as one example of a semiconductor device in accordance with the present invention, will be described.

Figure 1:
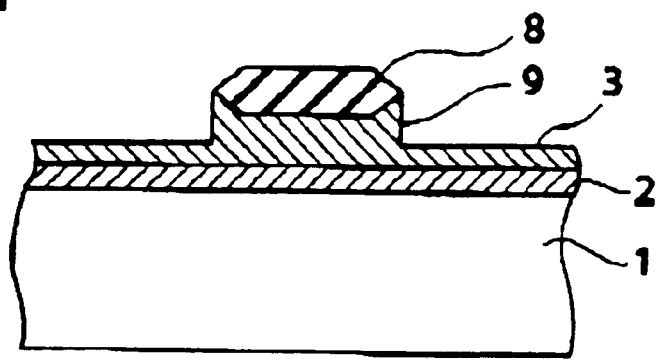
FIG. 1 is a cross-sectional view of a semiconductor device in a step of a manufacturing method in accordance with one embodiment of the present invention.
Figure 6:
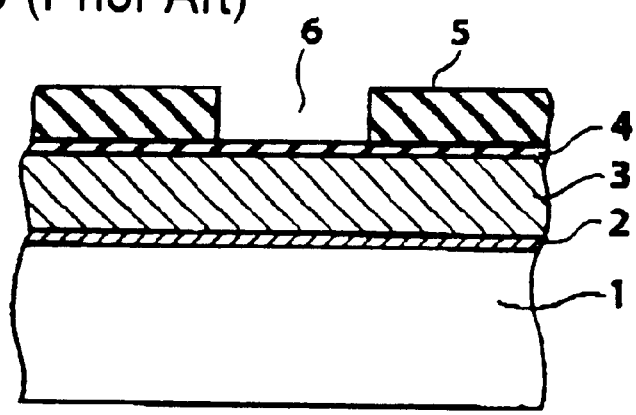
FIG. 6 is a cross-sectional view of a semiconductor device in a step of a conventional manufacturing method.
Figure 7:
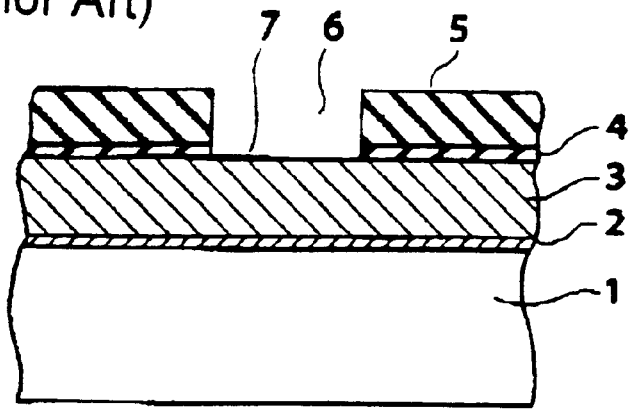
FIG. 7 is a cross-sectional view of the semiconductor device in a step of the conventional manufacturing method, subsequent to the step shown in FIG. 6.
Figure 8:
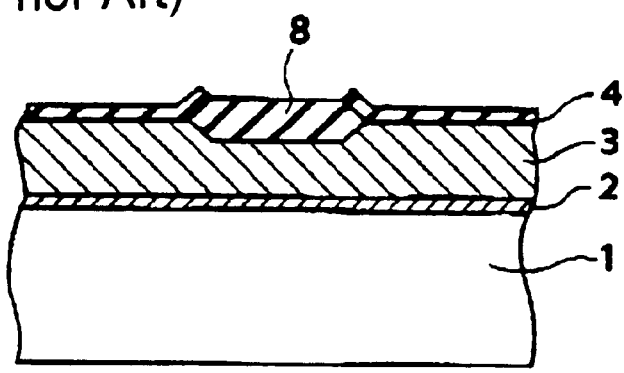
FIG. 8 is a cross-sectional view of the semiconductor device in a step of the conventional manufacturing method, subsequent to the step shown in FIG. 7.
Figure 9:
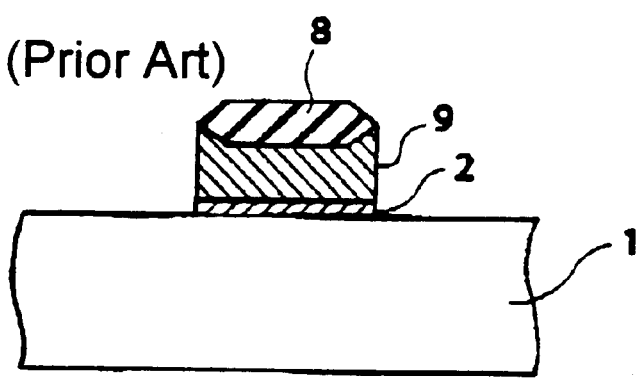
FIG. 9 is a cross-sectional view of the semiconductor device in a step of the conventional manufacturing method, subsequent to the step shown in FIG. 8.
Figure 10:
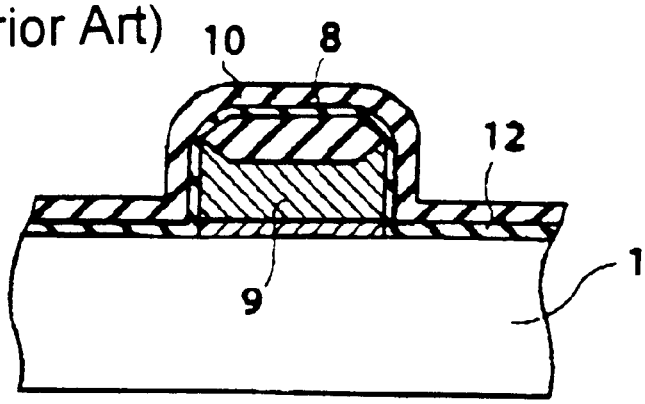
FIG. 10 is a cross-sectional view of the semiconductor device in a step of the conventional manufacturing method, subsequent to the step shown in FIG. 9.
Figure 11:
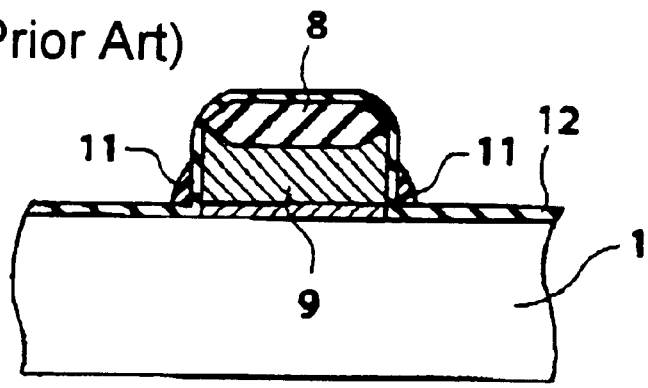
FIG. 11 is a cross-sectional view of the semiconductor device in a step of the conventional manufacturing method, subsequent to the step shown in FIG. 10.
Figure 12:
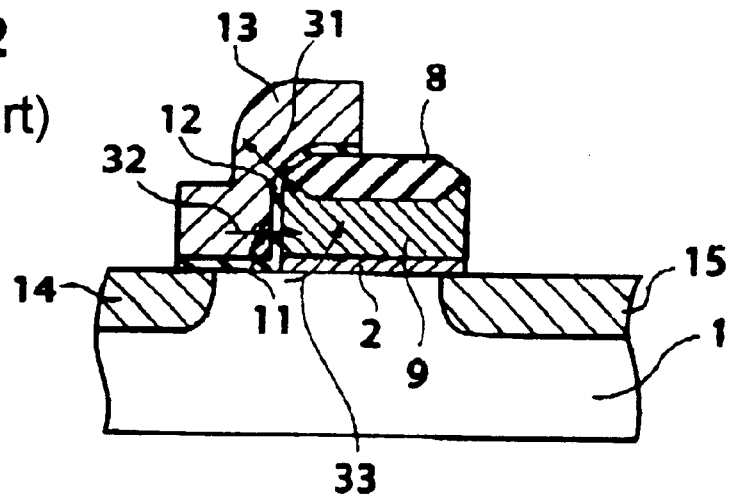
FIG. 12 is a cross-sectional view of the semiconductor device in a step of the conventional manufacturing method, subsequent to the step shown in FIG. 11.

In the semiconductor device manufacturing method in accordance with the present embodiment, the same steps as those shown in FIGS. 6–8 of the conventional method are conducted before the step shown in FIG. 1. More specifically, first, referring to FIG. 6, a gate oxide film 2 of $SiO_2$ is formed on a P-type silicon substrate 1. Then, a polycrystal silicon film 3 is deposited on the gate oxide film 2 by a reduced-pressure CVD. An anti-oxidation film 4 of $Si_3N_4$ is deposited on the polycrystal silicon film 3. Thereafter, an opening 6 is formed in the anti-oxidation film 4 in an area where a floating gate is formed.

Referring to FIG. 7, the anti-oxidation film 4 that is exposed through the opening 6 is dry-etched, using a resist film 5 as a mask to thereby form an opening 7 in the anti-oxidation film 4. Then, referring to FIG. 8, the resist film 5 is removed. The polycrystal silicon film 3 that is exposed through the opening 7 is selectively etched, using the anti-oxidation film 4 as a mask to thereby form a selective oxidation film (LOCOS-like $SiO_2$ film) 8 in the polycrystal silicon film 3.

Then, referring to FIG. 1, the anti-oxidation film 4 is removed by heated phosphoric acid, and the polycrystal silicon film 3 is anisotropically etched in a vertical direction, using the selective oxidation film 8 as a mask. The etching is stopped before it reaches the gate oxide film 2. In other words, the etching is stopped halfway through the polycrystal silicon film 3. By anisotropically etching the upper portion of the polycrystal silicon film 3, an upper portion of the floating gate 9 is formed below the selective oxidation film 8. For example, the etching of the polycrystal silicon film 3 is conducted under the following conditions:

A high density plasma-etching apparatus is used. The pressure within the apparatus is set at about 5 mTorr, and an etching gas of HBr and $O_2$ with a mixing ratio of about 50:1 is flown in the apparatus. Under this condition, the polycrystal silicon film 3 is etched in a vertical direction. It is noted that the high density plasma-etching apparatus can maintain a stable plasma within a high level of vacuum (several mTorr–several tens mTorr), and can conduct the etching step in a high-density plasma.

Figure 2:
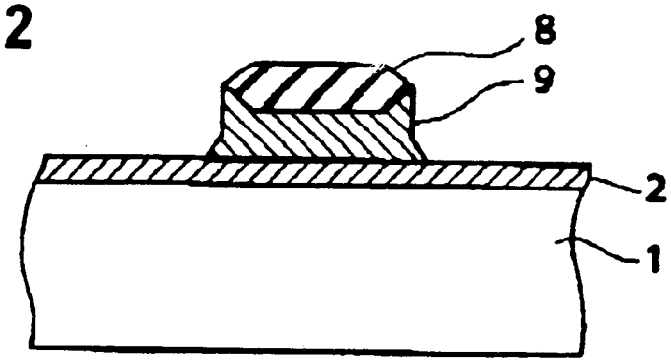
FIG. 2 is a cross-sectional view of the semiconductor device in a step of the manufacturing method, subsequent to the step shown in FIG. 1, in accordance with one embodiment of the present invention.

Subsequent to the above-described etching step, as shown in FIG. 2, the polycrystal silicon film 3 is etched into a tapered configuration, using the selective oxidation film 8 as a mask, to thereby form a lower portion of the floating gate 9 below the selective oxidation film 8. The etching to form the lower portion of the floating gate 9 is conducted under the following conditions:

The same high density plasma-etching apparatus that is used to form the upper portion of the floating gate 9 may be used. While the pressure within the apparatus is set at about 5 mTorr, an etching gas of HBr and $O_2$ is flown with its mixing ratio being changed to about 30:1–10:1. Under this condition, the polycrystal silicon film 3 is etched in a tapered configuration. For example, as shown in FIG. 2, the side wall of the floating gate 9 in its lower portion gradually extends more outwardly as it reaches toward the bottom of the floating gate 9 to thereby provide the floating gate 9 with a tapered lower side wall or a tapered configuration.

The etching provides the tapered configuration because of the following reason. When the flow rate of $O_2$ in the etching gas of HBr and $O_2$ is increased, a deposit of a composition, SiBrO, is formed on the etched surface, with the result that the etching rate for Si is lowered.

The angle of the taper can be adjusted to be greater or smaller by adjusting the mixing ratio of HBr and $O_2$.

The tapered configuration can be controlled by changing the energy applied to the plasma to thereby change the plasma condition during the etching process, or by changing the pressure in the apparatus. However, to control the tapered configuration of a very fine structure, such as the floating gate 9 of the flash memory cell in accordance with the present embodiment, the flow ratio of etching gases may preferably be controlled. Such a control achieves a better reproducibility of the tapered configuration than adjusting the pressure and the application of power to thereby make a substantial change in the etching condition.

With respect to an etch endpoint in the structure shown in FIG. 2, the apparatus can determine etch endpoint when the etching reaches the $SiO_2$ film 2 and automatically stops the etching if a sufficient selection ratio is given between the polycrystal silicon film 3 and the gate oxide film ($SiO_2$ film) 2.

Figure 3:
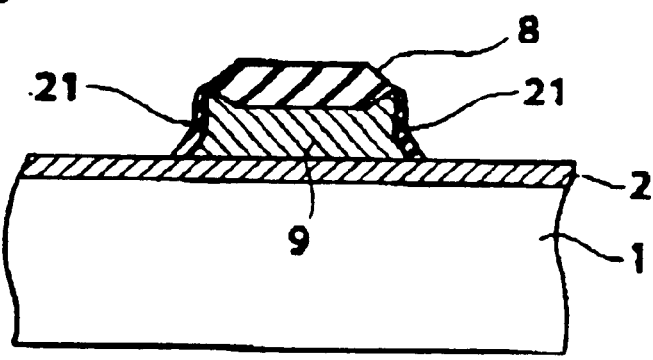
FIG. 3 is a cross-sectional view of the semiconductor device in a step of the manufacturing method, subsequent to the step shown in FIG. 2, in accordance with one embodiment of the present invention.

Then, as shown in FIG. 3, a silicon oxide film 21 is formed on the side wall of the floating gate 9 by thermal oxidation. In this instance, the silicon oxide film 21 is thinly formed in an upper section of the side wall of the floating gate 9, and the silicon oxide film 21 is thickly formed in a lower section of the side wall of the floating gate 9. The reasons for this phenomenon will be described below.

Figure 4:
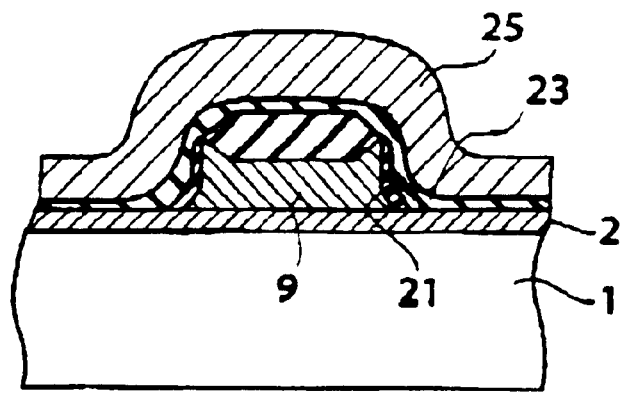
FIG. 4 is a cross-sectional view of the semiconductor device in a step of the manufacturing method, subsequent to the step shown in FIG. 3, in accordance with one embodiment of the present invention.

As shown in FIG. 4, an oxide film 23 is deposited over the entire surface including the silicon oxide film 21 and the selective oxide film 8 by a CVD method at temperatures of 750° C.–850° C. Then, an N-type polycrystal silicon film 25 is deposited on the oxide film 23 by a reduced-pressure CVD method under a phosphine ($PH_3$) atmosphere.

Figure 5:
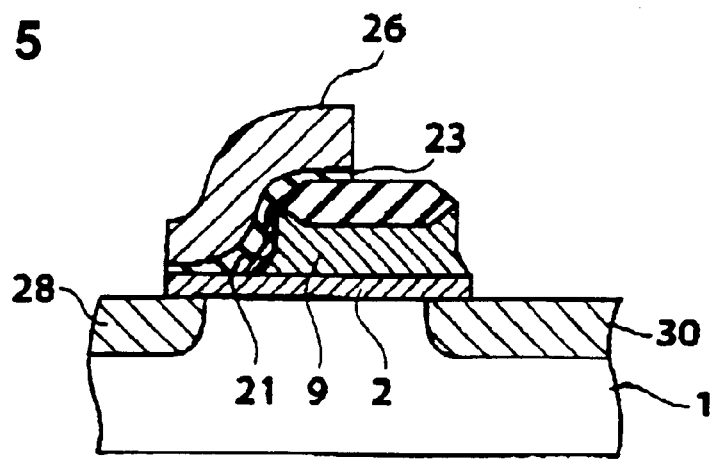
FIG. 5 is a cross-sectional view of the semiconductor device in a step of the manufacturing method, subsequent to the step shown in FIG. 4, in accordance with one embodiment of the present invention.

Then, as shown in FIG. 5, the polycrystal silicon film 25 and the oxide film 23 are patterned, such that the polycrystal silicon film 25 and the oxide film 23 remain on an area extending from a point on the selective oxide film 8, across one side of the floating gate 9 to a point on the P-type silicon substrate 1. The remaining polycrystal silicon film defines a control gate 26.

Then, an N-type impurity such as arsenic, phosphorous and the like is introduced in the P-type silicon substrate 1 on both sides of the control gate 26 and the floating gate 9 to form diffusion layers 28 and 30 for source and drain regions in the P-type silicon substrate 1.

In accordance with the embodiment described above, the upper section of the floating gate 9 is vertically etched, and a thin layer of the polycrystal silicon, which is a source that is subjected to oxidation, generally vertically extends on the upper section of the floating gate 9. As a result, thermal oxidation of the upper section forms substantially no oxide film. Therefore, an insulation layer between the upper section of the floating gate 9 and the control gate 26 generally has a thickness of the second oxide film 23 alone. On the other hand, since the lower section of the floating gate 9 is formed in a tapered configuration, the lower section has a relatively thick layer of the polycrystal silicon to be oxidized. In other words, the lower section of the floating gate 9 has a thicker layer of the polycrystal silicon than the upper section of the floating gate 9. When this lower section is thermally oxidized, a relatively thick silicon oxide film 21 can be fanned. The thickness of the silicon oxide film 21 over the lower section of the floating gate 9 can be substantially greater than the thickness of the silicon oxide film 21 over the upper section of the floating gate 9. Accordingly, an insulation layer between the lower section of the floating gate 9 and the control gate 26 has a thickness equal to the sum of thickness of the first silicon oxide film 21 and the second oxide film 23. By this structure, the insulation film between the control gate 26 and the floating gate 9 has a sufficient thickness difference between the upper section and the lower section of the side wall of the floating gate 9. As a consequence, the insulation film has a relatively low dielectric strength in the upper section of the side wall of the floating gate 9 and a higher dielectric strength in the lower section of the floating gate 9.

Also, a semiconductor device in accordance with the present embodiment does not need to form a side section insulation film composed of $Si_3N_4$ ($Si_3N_4$ spacer) in contrast to the conventional semiconductor device. Therefore, it is not necessary to conduct a step of anisotropically etching an insulation film composed of an $Si_3N_4$ film in a vertical direction. As a result, problems encountered in this etching step in the conventional method are solved. In other words, the tunnel oxide film and $SiO_2$ films in other areas (for example, gate oxide films that compose high dielectric transistors around the memory cell) are not etched away. As a consequence, the device characteristics do not become unstable. In addition, the manufacturing process is simplified.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive. The scope of the invention is indicated by the appended claims, rather than the foregoing description, and all changes which come within the meaning and range of equivalency of the claims are therefore intended to be embraced therein.

What is claimed is:

1. A semiconductor device comprising:
    a floating gate having a side wall with a generally vertical upper section and a tapered lower section;
    a single layer of insulation film formed on the side wall by thermal oxidation, the single layer of insulation film having an upper section and a lower section thicker than the upper section;
    a second layer of insulation film formed on the single layer of insulation film; and
    a control gate formed on the second insulation film.

2. The semiconductor device according to claim 1, wherein the space between a selective oxide film and the control gate includes the second insulation film and is substantially free of the single layer of insulation film.

3. A semiconductor device, comprising:
    a floating gate having a side wall with a generally vertical upper section and an outwardly tapered lower section;
    a control gate; and
    a composite insulation layer disposed between the floating gate and the control gate, comprising:
        a single layer of insulation film formed on the side wall, and
        a second layer of insulation film formed on the single layer of insulation film, wherein the control gate is formed on the second insulation film,
    wherein the thickness of the composite insulation layer between an upper portion of the generally vertical upper section of the floating gate and the control gate is substantially equal to the thickness of the second layer of insulation film to thereby provide the composite insulation layer having substantially a first dielectric strength between the upper portion of the generally vertical upper section of the floating gate and the control gate.

4. The semiconductor device according to claim 3, wherein the single layer comprises silicon oxide, and wherein the single layer of silicon oxide insulation film has an upper section and a lower section thicker than the upper section.

5. The semiconductor device according to claim 3, wherein the single layer comprises silicon oxide, and wherein the single layer of silicon oxide insulation film has an upper section and a lower section thicker than the upper section, such that there is a thickness difference in the single layer of insulation film between the lower section and the upper section thereof.

6. The semiconductor device according to claim 3, wherein the single layer comprises silicon oxide, and wherein the thickness of the composite insulation layer between the outwardly tapered lower section of the floating gate and the control gate is substantially equal to the thickness of the second layer of insulation film and the thickness of the single layer of silicon oxide insulation film.

7. The semiconductor device according to claim 3, wherein the single layer comprises silicon oxide, and wherein the thickness of the composite insulation layer between the outwardly tapered lower section of the floating gate and the control gate is substantially equal to the thickness of the second layer of insulation film and the thickness of the single layer of silicon oxide insulation film, to thereby provide the composite insulation layer having a second dielectric strength between the outwardly tapered lower section of the floating gate and the control gate.

8. The semiconductor device according to claim 7, wherein the second dielectric strength is greater than the first dielectric strength.

9. The semiconductor device according to claim 3, wherein the single layer comprises silicon oxide, and wherein the single layer of silicon oxide insulation film is formed only on the side wall by thermal oxidation.

10. The semiconductor device according to claim 3, wherein the single layer of insulation film is formed only on the side wall and comprises a silicon oxide film.

11. The semiconductor device according to claim 3, wherein the control gate comprises an N-type polycrystal silicon film.

12. The semiconductor device according to claim 3, wherein the upper portion of the generally vertical upper section of the floating gate is located near a boundary between:
    the floating gate, and
    an oxide film disposed on the floating gate.

13. A semiconductor device, comprising:
    a floating gate having a side wall with a generally vertical upper section and a tapered lower section;
    a control gate; and
    a composite insulation layer disposed between the floating gate and the control gate comprising:
        a single layer of insulation film formed on the side wall, wherein the single layer of insulation film has an upper section and a lower section thicker than the upper section, such that there is a thickness difference in the single layer of insulation film between the lower section and the upper section thereof, and
        a second layer of insulation film formed on only the single layer of insulation film,
    wherein the control gate is formed on the second layer of insulation film,
    wherein the thickness of the composite insulation layer between an upper portion of the generally vertical upper section of the floating gate and the control gate is substantially equal to the thickness of the second layer of insulation film.

14. The semiconductor device according to claim 13, wherein the tapered lower section comprises an outwardly tapered lower section.

15. The semiconductor device according to claim 14, wherein the thickness of the composite insulation layer between the outwardly tapered lower section of the floating gate and the control gate is substantially equal to the thickness of the second layer of insulation film and the thickness of the single layer of insulation film.

16. The semiconductor device according to claim 13, wherein the thickness of the composite insulation layer between the upper portion of the generally vertical upper section of the floating gate and the control gate is substantially equal to the thickness of the second layer of insulation fun to thereby provide the composite insulation layer with a first dielectric strength between the upper portion of the generally vertical upper section of the floating gate and the control gate.

17. The semiconductor device according to claim 16, wherein the tapered lower section comprises an outwardly tapered lower section, and wherein the thickness of the composite insulation layer between the outwardly tapered lower section of the floating gate and the control gate is substantially equal to the thickness of the second layer of insulation film and the thickness of the single layer of insulation film, to thereby provide the composite insulation layer with a second dielectric strength between the outwardly tapered lower section of the floating gate and the control gate.

18. The semiconductor device according to claim 17, wherein the second dielectric strength is greater than the first dielectric strength.

19. The semiconductor device according to claim 13, wherein the single layer of insulation film is formed on the side wall by thermal oxidation.

20. The semiconductor device according to claim 13, wherein the single layer of insulation film comprises a silicon oxide film.

21. The semiconductor device according to claim 13, wherein the second layer of insulation film comprises an oxide film.

22. The semiconductor device according to claim 13, wherein the control gate comprises an N-type polycrystal silicon film.

23. The semiconductor device according to claim 13, wherein the upper portion of the generally vertical upper section of the floating gate is located near a boundary between:

the floating gate, and an oxide film disposed on the floating gate.

* * * * *